(12) United States Patent
Loibl (10) Patent No.: US 10,856,419 B2
(45) Date of Patent: Dec. 1, 2020

(54) PRINTED CIRCUIT BOARD ASSEMBLY

(71) Applicant: ZF Friedrichshafen AG, Friedrichshafen (DE)

(72) Inventor: Josef Loibl, Bad Abbach (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 20 days.

(21) Appl. No.: 16/320,815

(22) PCT Filed: Jun. 26, 2017

(86) PCT No.: PCT/EP2017/065685
§ 371 (c)(1),
(2) Date: Jan. 25, 2019

(87) PCT Pub. No.: WO2018/019500
PCT Pub. Date: Feb. 1, 2018

(65) Prior Publication Data
US 2019/0174628 A1  Jun. 6, 2019

(30) Foreign Application Priority Data

Jul. 26, 2016  (DE) .................... 10 2016 213 697

(51) Int. Cl.
*H05K 1/00* (2006.01)
*H05K 1/14* (2006.01)
(Continued)

(52) U.S. Cl.
CPC ............. *H05K 1/144* (2013.01); *H05K 1/147* (2013.01); *H05K 1/185* (2013.01); *H05K 3/288* (2013.01);
(Continued)

(58) Field of Classification Search
CPC ...... H05K 1/144; H05K 3/288; H05K 5/0095; H05K 1/185; H05K 1/147;
(Continued)

(56) References Cited

U.S. PATENT DOCUMENTS 4,729,062 A     3/1988 Anderson et al.
6,303,860 B1 * 10/2001 Van Rens .............. H01L 21/56
                                                    174/521

(Continued)

FOREIGN PATENT DOCUMENTS

DE          2 363 925        12/1973
DE   10 2012 214 721 A1       2/2014
(Continued)

OTHER PUBLICATIONS

International Preliminary Report on Patentability for PCT/EP2017/065685, dated Jan. 29, 2019, 9 pp.
(Continued)

*Primary Examiner* — Yuriy Semenenko
(74) *Attorney, Agent, or Firm* — Brinks Gilson & Lione (57) ABSTRACT

A printed circuit board assembly (1) is provided that comprises a stacked or folded printed circuit board populated by components (2, 3), wherein printed circuit board regions (10, 11, 12) lying opposite one another are electrically connected to one another at least one edge, and wherein the printed circuit board and the components (2, 3) are encased in an encapsulation (4), and wherein at least one separating element (5) is located inside the encapsulation and between each pair of opposing and electrically connected printed circuit board regions (10, 11, 12).

20 Claims, 5 Drawing Sheets

(51) Int. Cl.
*H05K 3/28* (2006.01)
*H05K 1/18* (2006.01)
*H05K 5/00* (2006.01)
*H05K 3/46* (2006.01)

(52) U.S. Cl.
CPC ........... *H05K 5/0095* (2013.01); *H05K 1/148* (2013.01); *H05K 3/284* (2013.01); *H05K 3/4697* (2013.01); *H05K 2201/042* (2013.01); *H05K 2201/09036* (2013.01); *H05K 2201/2036* (2013.01); *H05K 2203/0228* (2013.01); *H05K 2203/1316* (2013.01); *H05K 2203/308* (2013.01)

(58) Field of Classification Search
CPC ......... H05K 2201/09036; H05K 3/284; H05K 2203/0228; H05K 2203/1316; H05K 2201/2036; H05K 1/148; H05K 2203/308; H05K 3/4697; H05K 2201/042
USPC ........................................................ 361/749
See application file for complete search history.

(56) References Cited

U.S. PATENT DOCUMENTS

| | | | |
|---|---|---|---|
| 2007/0158799 A1* | 7/2007 | Chiu | H01L 23/49805 257/678 |
| 2009/0086454 A1 | 4/2009 | Sakamoto et al. | |
| 2009/0242243 A1* | 10/2009 | Bagung | H05K 1/0278 174/254 |
| 2014/0145565 A1* | 5/2014 | Gottwald | H05K 1/18 310/68 D |
| 2015/0098196 A1* | 4/2015 | Palmer | H05K 3/284 361/749 |
| 2017/0005077 A1* | 1/2017 | Kim | G02B 6/0068 |
| 2017/0062992 A1* | 3/2017 | Fischeneder | H05K 1/185 |

FOREIGN PATENT DOCUMENTS

| | | |
|---|---|---|
| DE | 10 2013 209 296 A1 | 11/2014 |
| EP | 2 882 268 A1 | 12/2013 |
| WO | 2013/172849 A2 | 11/2013 |

OTHER PUBLICATIONS

Written Opinion for PCT/EP2017/065685, dated Oct. 9, 2017, 15 pp.
International Search Report for PCT/EP2017/065685, dated Sep. 29, 2017, 7 pp.

* cited by examiner

PRINTED CIRCUIT BOARD ASSEMBLY

This application is a filing under 35 U.S.C. § 371 of International Patent Application PCT/EP2017/065685, filed Jun. 26, 2017, and claims the priority of DE 10 2016 213 697.6, filed Jul. 26, 2016. These applications are incorporated by reference herein in their entirety.

The present invention relates to a printed circuit board assembly according to the preamble of claim 1.

Controlling the functions of a vehicle, e.g. the control of automatic transmissions, light functions, motor functions, etc. takes place increasingly frequently via control devices, e.g. electronic control devices such as electronic transmission control units and similar ECUs (electronic control units). Integrated control devices as well as add-on and replaceable control units are known from the prior art. Add-on and replaceable control units have the advantage that they can be developed and produced relatively inexpensively due to the low number of components in the control unit itself. The main components of a control device are a housing that encases one or more printed circuit boards for electronic function control, and connections for external wiring.

In order to protect the electronics, printed circuit boards are encapsulated in various ways, such that the electronic components are protected against external effects. This can be achieved inexpensively by spraying or encapsulating the components that are to be protected with a casting compound. Such casting compounds are preferably hardening casting compounds, and can comprise, e.g. polyurethane, silicone or epoxy resins. The important thing here is that they provide the necessary protection of the components against external influences.

If the electronics on one of the printed circuit boards fail or malfunction, the defective printed circuit board is removed from the housing and subjected to a malfunction analysis. This often involves the problem of removing the printed circuit board from the protective casting compound with as little effort as possible.

One example of an encapsulated printed circuit board assembly in which an additional element for the easy separation of the individual components is disclosed, is depicted in the US patent with the publication number U.S. Pat. No. 4,729,062 A1. This patent application discloses a separating film disposed between a frame and a foam serving as packaging material.

Another possibility is to apply a protective layer or film, e.g. made of lacquer, plastic or rubber, directly on top of the electronic assembly, and to subsequently apply the hardening casting compound, e.g. foam, plastic or resin. In this manner, the casting compound forms a solid mass separated from the electronic components by the film, and is attached to neither the protective layer nor the film. Thus, in the event of a failure, the hardened casting compound can simply be removed from the film, like a lid, and the electronic components can be examined for defects. Such solutions are depicted, e.g., in the European patent application EP 2882268 A1, or the German patent application DE 2363925 A1.

One disadvantage with the known seals is that it is difficult to reduce the size of the overall assembly due to the encapsulation, while retaining the possibility of systematically searching for defects. For this reason, one object of this invention is to create a printed circuit board assembly by means of which it is possible to obtain a compact installation shape as well as achieve a systematic defect analysis.

This problem is solved according to the invention by the features of the independent claims. Advantageous embodiments form the subject matter of the dependent claims.

A printed circuit board assembly is proposed that comprises at least one stacked or folded printed circuit board populated with components, wherein the printed circuit board regions of the printed circuit board lying opposite one another are electrically connected to one another at least one edge, and wherein the printed circuit boards and the components are encapsulated, and wherein at least one separating element is disposed inside the encapsulation and between each pair of the opposing and electrically connected printed circuit board regions.

In one embodiment, the separating element is fully embedded inside the encapsulation.

In one embodiment, the printed circuit board is a folded printed circuit board, and the printed circuit board regions are connected to one another electrically by means of a flexible printed circuit board region. The flexible printed circuit board region is preferably a region in the printed circuit board that has been deep milled.

In one embodiment, the printed circuit board is a stacked printed circuit board, and the printed circuit board regions are each electrically connected to one another by means of an electrical connecting element on at least one of their edges. The electrical connecting element is preferably a press-fit connector.

In one embodiment, the printed circuit board assembly comprises stacked and folded printed circuit boards.

A clean and defined separation of the printed circuit board regions can be obtained through the provision of a separating element inside the encapsulation and between the pairs of opposing printed circuit board regions populated with components. As a result, it is possible to expose the components after removal from the encapsulation, such that a systematic (defect) analysis can be carried out. Furthermore, because of the separating elements, less casting compound is necessary, further reducing costs and weight. Moreover, a sealed encapsulation is ensured, because the edges of the separating element can be fully embedded in the casting compound. Depending on the embodiment, a combination of stacked and folded printed circuit boards can also be used.

In one embodiment, the separating element comprises a hollow body, two plastic parts, or two films lying against one another. The hollow body is preferably made of plastic. The selection of the material and the type of separating element should be such that removal of the separating element is simplified. If two adjacent films are used, it may be sufficient to expose the edges of the film, such that the films can then be pulled apart, thus separating the printed circuit board regions.

Furthermore, a method for separating the stacked or folded printed circuit boards described above is provided, wherein the separating element is divided along a separating plane in order to separate the printed circuit board regions, such that the printed circuit board regions separated by the separating element can be accessed.

In one embodiment, the division of the separating element is obtained with a laser process, milling process, or cutting process.

In one embodiment, the components on the printed circuit board facing the separating element are exposed by means of a laser process or a chemical process, or a combination thereof.

Further features and advantages of the invention can be derived from the following description of exemplary embodiments of the invention based on the drawings, which illustrate details of the invention, and from the claims. The individual features can be implemented in and of themselves or in arbitrary combinations with other features, forming a variation of the invention.

Preferred embodiments of the invention shall be explained in greater detail below based on the drawings. Therein.

Identical elements or functions are provided with the same reference symbols in the following description of the figures.

The term "encapsulation" or "encasing" shall be used for purposes of simplicity in the following.

Printed circuit board assemblies populated on one side as well as on both sides are shown in the figures, wherein the present invention is not limited thereto. Printed circuit boards or printed circuit board assemblies populated on just one side or both sides can also be encased with the same technique.

Figure 1:
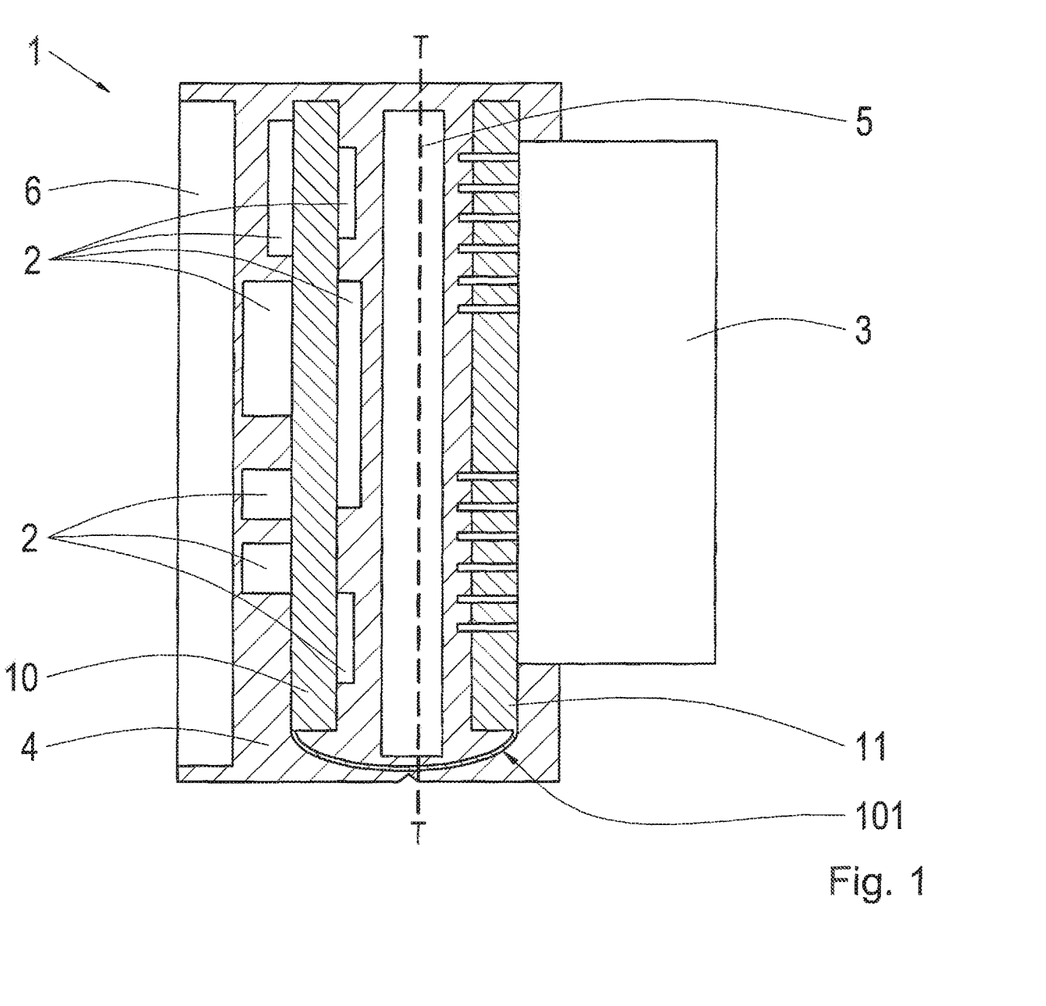
FIG. 1 shows a schematic sectional view of an encapsulated printed circuit board assembly according to one embodiment of the present invention.
Figure 2:
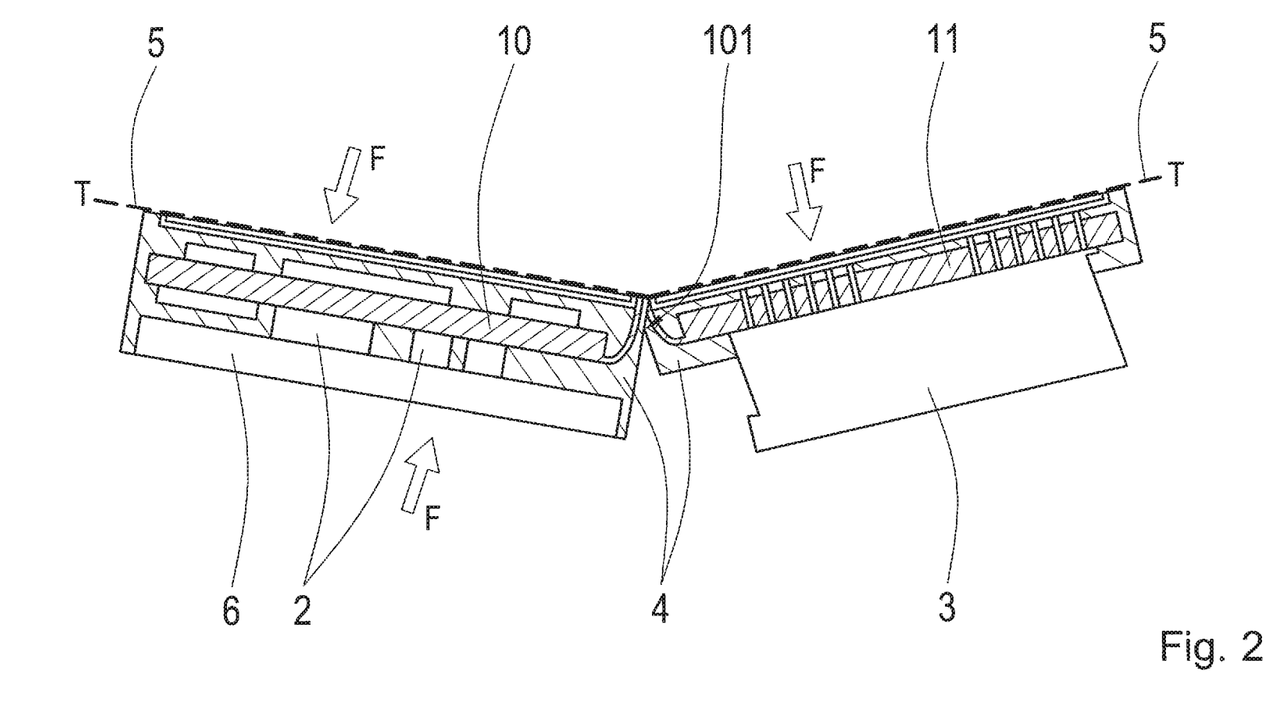
FIG. 2 shows a schematic sectional view of the encapsulated printed circuit board, separated along the separating plane, that is shown in FIG. 1.

FIG. 1 shows a schematic sectional view of an encapsulated printed circuit board assembly 1 according to one embodiment of the present invention. FIG. 2 shows a schematic sectional view of the printed circuit board assembly 1 shown in FIG. 1, which is encapsulated and separated at the separating plane T-T. In this regard, the references to FIG. 1 also apply to FIG. 2.

A folded printed circuit board assembly 1 populated with different electrical or electronic components 2 and a plug 3 is shown in FIGS. 1 and 2. The components 2 disposed on both sides of the printed circuit board region 10 in FIGS. 1 and 2 can comprise ICs, resistors, capacitors, etc., wherein these are selected according to the application, and can be disposed in different embodiments on both printed circuit board regions 10 and 11 on both sides or on just one side. The plug 3 shown in FIG. 1 is connected to the printed circuit board region 11 by soldering or by means of a press-fit connection, but can also be connected thereto by some other means. There is also a heat sink 6 on the outer surface of the printed circuit board region 10 in FIGS. 1 and 2. This is an optional component for heat discharge, and for this reason needs no further explanation.

The printed circuit board 1 with the printed circuit board regions 10 and 11 and the components 2 and 3 is encased in an encapsulation 4. The encapsulation 4 surrounds both the printed circuit board regions 10 and 11 as well as the electrical components 2, and at least a portion of the plug 3 connected to a part of the printed circuit board, as well as the separating element 5 and at least part of the heat sink 6, if present. A complete and sealed encapsulation of the electrical components, or the electronics, on the printed circuit board regions 10, 11 is ensured. The encapsulation 4 is a casting compound or molding compound that is applied in the liquid state and later hardened. Thermosetting materials or epoxy resins or silicone or other appropriate materials can be used for this.

A folded printed circuit board assembly 1 is distinguished in that a single printed circuit board is divided into at least two printed circuit board regions 10 and 11 connected to one another by means of a flexible region 101. The flexible region 101 can be a deep milled region in the individual printed circuit board, rendering it flexible or bendable. As a result, two printed circuit board regions 10 and 11 of the printed circuit board that are connected by this flexible region 101 can be folded together such that they are spaced apart, or form a predefined angle. The flexible region 101 thus forms an edge or end region of the printed circuit board regions 10 and 11. A separating element 5 can then be inserted in the spacing between the printed circuit board regions 10 and 11, as shown in FIG. 1. This separating element enables a simple separation of the opposing printed circuit board regions 10 and 11 if a defect or malfunction has been detected, such that the components 2 and/or the plug 3 can be easily accessed on the side facing the separating element 5. For this, either the flexible region 101 is cut in the separation, such that the printed circuit boards 10, 11 are separated from one another, or it is separated up to the flexible region 101, and the printed circuit board regions 10, 11 are then bent apart. More than two printed circuit board regions can also be separated here by a flexible region, depending on the application.

The separation takes place in FIG. 1 in the separating plane T-T along the longitudinal direction of the separating element 5. The printed circuit board assembly 1 shown in FIG. 1 is separated in FIG. 2 along the separating plane T-T. It can be seen therein that a predefined region is obtained through the provision of the separating element 5, which can be cut, e.g. with a laser process, milling process, cutting process or other appropriate process, depending on the material of the encapsulation 4 and the separating element 5, without damaging the components 2 and/or the plug 3. The region in which the separating element is located is defined by the structure of the printed circuit board assembly 1, and thus known. The separating element 5 can exhibit a certain thickness in order to ensure that procedures that are not extremely precise can also be used for the separation without damaging the components. Alternatively, a tab can stick out of the encapsulation 4, indicating the position of the separating element. This may not always be possible, however, particularly when the encapsulation 4 must be extremely dense. In this regard, the person skilled in the art must determine whether or not such a tab can be used.

The components 2 and/or the plug 3 can be easily accessed after removing the separating element 5, and can be exposed using a suitable process. Such a process comprises, e.g., a laser process, or a chemical process. The selection of which process to use depends on the material of the separating element 5, part of which may remain on the encapsulation 4 after its removal, as well as the material of the encapsulation 4. Different processes can also be used for exposing F the components 2 and/or the plug 3.

Figure 3:
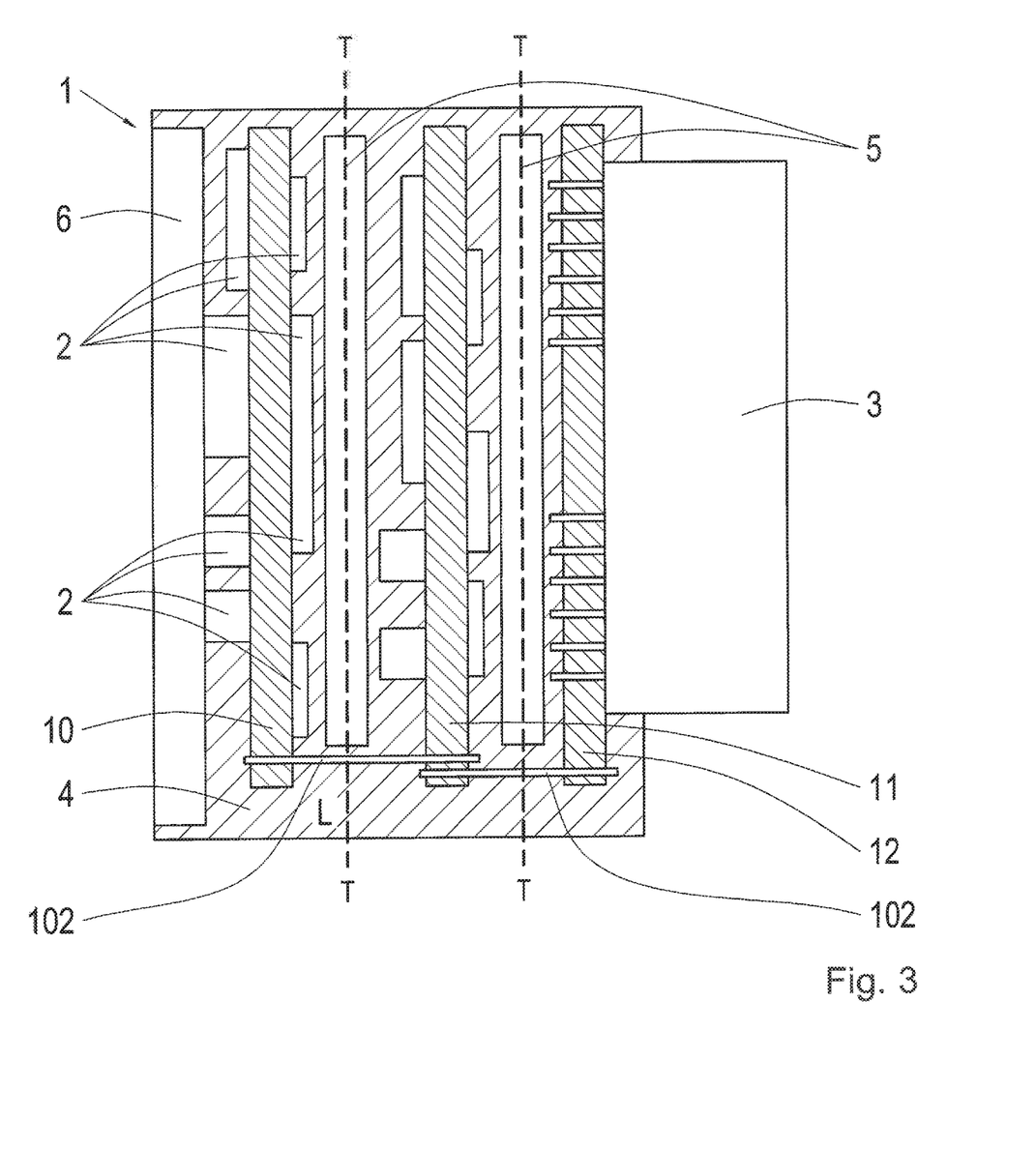
FIG. 3 shows a schematic sectional view of an encapsulated printed circuit board assembly according to an alternative embodiment of the present invention.
Figure 4:
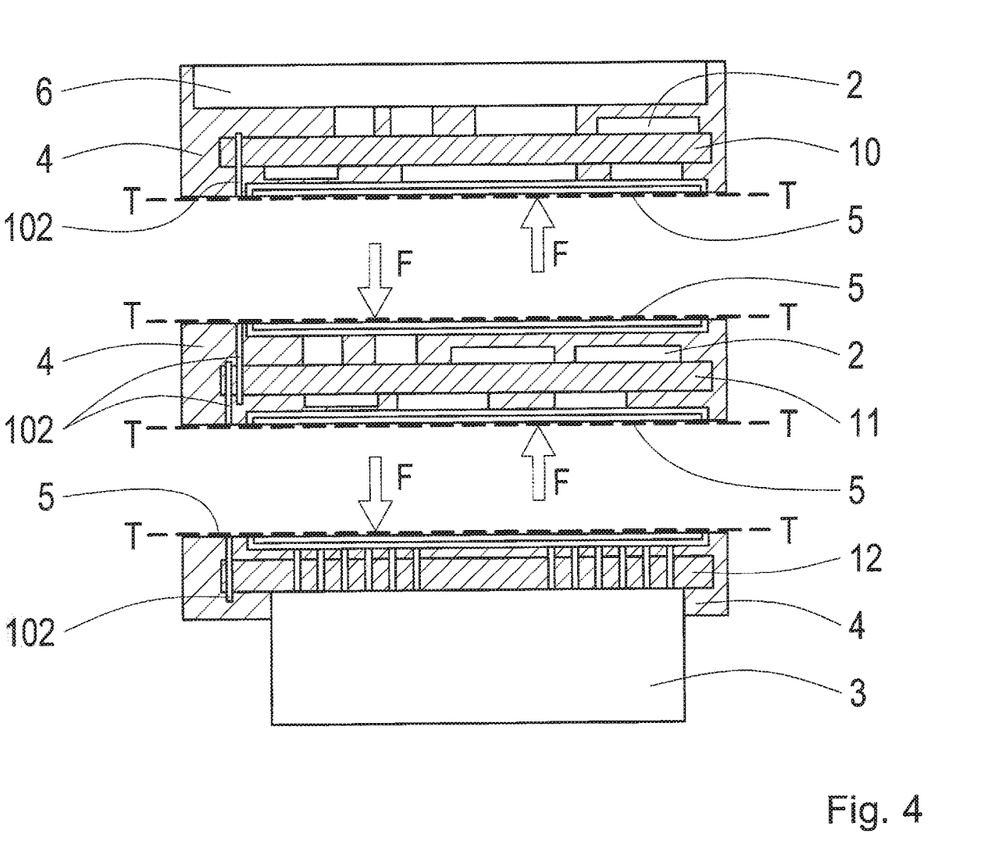
FIG. 4 shows a schematic sectional view of the encapsulated printed circuit board separated at the separating plane, that is shown in FIG. 3.

An alternative printed circuit board 1 is shown in FIGS. 3 and 4. This differs from that in FIGS. 1 and 2 only in that it is not folded, and is stacked instead. In this case, three printed circuit board regions 10, 11, and 12 are disposed at a spacing to one another, and facing one another. Separating elements 5 are also located between the printed circuit board regions 10, 11, and 12 here, in order to be able to separate them from one another. In the stacked printed circuit board assembly 1 shown therein, the printed circuit board regions 10, 11, and 12 are electrically connected to one another by electrical connecting elements 102, preferably at one of their edges, i.e. the printed circuit board regions 10, 11, and 12 are formed by individual, separate printed circuit boards that are electrically connected via the electrical connecting elements 102. Depending on the application, it may make more sense to use folded or stacked printed circuit board assemblies, or a combination thereof. The person skilled in the art can decide this. The fundamental principle of the invention, specifically the provision of a suitable separating element 5, remains the same.

As explained in reference to FIGS. 1 and 2, the separation of the respective printed circuit board regions 10, 11, and 12 is obtained by a longitudinal cutting through the separating elements, i.e. along the separating plane T-T. Because there are three printed circuit board regions 10, 11, and 12 in FIGS. 3 and 4, just two of the three printed circuit board regions 10, 11, and 12 can be separated, or all three printed circuit board regions 10, 11, and 12 can be separated, depending on which of the separating elements 5 are cut through. This can be dependent on where the defect is located, or presumed to be, thus, e.g., between the printed circuit board regions 10 and 11, or between the printed circuit board regions 11 and 12. As explained in reference to FIGS. 1 and 2, the components 2 and/or the plug 3 can be exposed F through a suitable process or a suitable combination of different processes after removing the separating element 5, and a malfunction analysis can then be carried out.

Two printed circuit board regions 10 and 11 are shown in FIGS. 1 and 2, which are connected to one another by means of a flexible region 101. The invention is not limited, however, to a folded printed circuit board assembly with two printed circuit board regions 10 and 11. Instead, numerous printed circuit board regions 10 and 11 can be provided that are electrically connected to one another by a flexible region 101. It is also possible to combine this with the stacked printed circuit board assembly 1 described above. The stacked assembly shown in FIGS. 3 and 4 is likewise not limited to the three printed circuit board regions shown therein. Instead, more or fewer printed circuit board regions can be used, depending on the application.

The necessary amount of encasing compound can be reduced by the separating element 5, thus reducing the costs as well as the weight thereof. The separating element 5 can be prevented from sliding out of the encapsulation 4 in that the separating element 5 is located inside the encasing compound, or encapsulation 4, such that it is completely encompassed therein, i.e. including its edges. The encapsulation 4 can nevertheless be selected such that it securely adheres to the components 2 and plug 3 that are to be encased, and to the printed circuit board 1, or the printed circuit board regions 10, 11, and/or 12, thus ensuring a reliable seal.

Furthermore, a simple, i.e. inexpensive, separating element 5 can be used. It must merely be able to withstand an encasing or casting with the encapsulation 4, i.e. such that it does not become deformed. It only needs to be easily removable. Furthermore, it can simply be a film, i.e. very thin. By exposing the components 2 and/or the plug 3 and thus making it possible to access the electronic components, standard analysis processes can be used for exposing them, e.g. laser processes or chemical processes.

Figure 5:
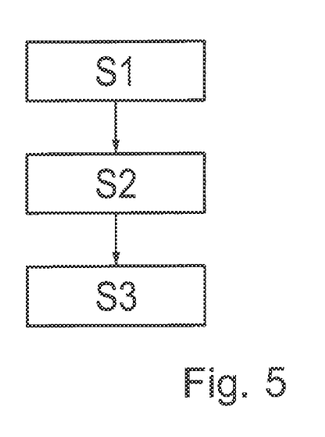
FIG. 5 shows a flow chart of the method for separating the printed circuit board regions according to an alternative embodiment of the present invention.

FIG. 5 shows the method steps that are carried out for separating the printed circuit board regions 10, 11, and/or 12. In a first step S1, the separating element 5 is cut along a separating plane T-T, as shown in FIGS. 1 to 4. The separation can take place by means of a suitable process, e.g. a cutting process, laser process, or milling process. In a second step S2, the separated printed circuit board regions 10, 11, and/or 12 are separated. In a third step S3, the components 2 and/or the plug 3 are exposed F for analysis, preferably by means of a laser process or a chemical process, or a combination thereof.

REFERENCE SYMBOLS 1 printed circuit board assembly
10, 11, 12 printed circuit board regions
101 flexible region of the printed circuit board
102 electrical connecting elements
2 electrical components
3 plug
4 encapsulation
5 separating element
6 heat sink
L length
B width
F exposure
T-T separating plane

The invention claimed is:

1. A printed circuit board assembly, comprising at least one stacked or folded printed circuit board populated with components, wherein printed circuit board regions lie opposite one another and are electrically connected at at least one of their edges, and wherein the at least one printed circuit board and the components are encased in an encapsulation, and wherein at least one separating element is located inside the encapsulation and between each pair of opposing and electrically connected printed circuit board regions.

2. The printed circuit board assembly according to claim 1, wherein the at least one printed circuit board is a folded printed circuit board and the printed circuit board regions are electrically connected to one another by means of a flexible printed circuit board region.

3. The printed circuit board assembly according to claim 2, wherein the flexible printed circuit board region is a region that has been deep milled from the at least one printed circuit board.

4. The printed circuit board assembly according to claim 1, wherein the at least one printed circuit board is a stacked printed circuit board, and the printed circuit board regions are each connected to one another by at least one electrical connecting element at at least one of an edge of the printed circuit board regions, the at least one electrical connecting element extending from a first of the printed circuit board regions to a second of the printed circuit board regions opposing the first of the printed circuit board regions.

5. The printed circuit board assembly according to claim 1, wherein the separating element comprises at least one of a hollow body or two adjacent films.

6. The printed circuit board assembly according to claim 1, wherein the printed circuit board assembly comprises stacked or folded printed circuit boards.

7. A method for separating the printed circuit board regions of the printed circuit board assembly of claim 1, the method further comprising dividing the separating element along a separating plane in order to separate the printed circuit boards to define a division, such that the printed circuit board regions separated by the separating element can be accessed.

8. The method according to claim 7, wherein the division of the separating element is obtained by one of a laser process, a milling process, or a cutting process.

9. The method according to claim 7, further comprising exposing the components on the printed circuit board facing the separating element by removing a portion of the encapsulation located between the components and the separating element by at least one of a laser process or a chemical process.

10. The method according to claim 9, further comprising removing at least a portion of the separating element prior to exposing the components.

11. The printed circuit board assembly according to claim 2, wherein the flexible printed circuit board region is fully embedded in the encapsulation.

12. The printed circuit board assembly according to claim 4, wherein the at least one electrical connecting element is fully embedded in the encapsulation.

13. A printed circuit board assembly, comprising at least one stacked or folded printed circuit board populated with components, wherein printed circuit board regions lie opposite one another and are electrically connected at at least one of their edges, and wherein the at least one printed circuit board and the components are encased in an encapsulation, and wherein at least one separating element is located inside the encapsulation and between each pair of opposing and electrically connected printed circuit board regions, wherein the separating element is fully embedded in the encapsulation.

14. The printed circuit board assembly according to claim 13, wherein the separating element comprises two plastic parts.

15. The printed circuit board assembly according to claim 13, wherein the at least one printed circuit board is a folded printed circuit board and the printed circuit board regions are electrically connected to one another by means of a flexible printed circuit board region.

16. The printed circuit board assembly according to claim 15, wherein the flexible printed circuit board region is fully embedded in the encapsulation.

17. The printed circuit board assembly according to claim 13, wherein the at least one printed circuit board is a stacked printed circuit board, and the printed circuit board regions are each connected to one another by at least one electrical connecting element at at least one of an edge of the printed circuit board regions.

18. The printed circuit board assembly according to claim 17, wherein the at least one electrical connecting element is fully embedded in the encapsulation.

19. The printed circuit board assembly according to claim 17, wherein the at least one electrical connecting element extends from a first of the printed circuit board regions to a second of the printed circuit board regions opposing the first of the printed circuit board regions.

20. The printed circuit board assembly according to claim 13, wherein the separating element comprises at least one of a hollow body, two plastic parts, or two adjacent films.

* * * * *